United States Patent [19]
Sato et al.

[11] Patent Number: 5,773,313
[45] Date of Patent: Jun. 30, 1998

[54] SEMICONDUCTOR DEVICE AND METHOD OF PRODUCING THE SAME

[75] Inventors: Mitsutaka Sato; Junichi Kasai, both of Kawasaki, Japan

[73] Assignee: Fujitsu Limited, Kawasaki, Japan

[21] Appl. No.: 547,616

[22] Filed: Oct. 24, 1995

Related U.S. Application Data

[62] Division of Ser. No. 136,462, Oct. 15, 1993, Pat. No. 5,519,251.

[30] Foreign Application Priority Data

Oct. 20, 1992 [JP] Japan .................................. 4-281951

[51] Int. Cl.$^6$ .................................................. H01L 21/60
[52] U.S. Cl. .......................... 437/216; 437/209; 437/214; 437/217; 437/219; 437/220
[58] Field of Search .................................. 437/209, 211, 437/214, 217, 218, 219, 220, 216

[56] References Cited

U.S. PATENT DOCUMENTS

| | | | |
|---|---|---|---|
| 4,280,132 | 7/1981 | Hayakawa et al. | 437/220 |
| 5,107,325 | 4/1992 | Nakayoshi | 257/692 |
| 5,134,773 | 8/1992 | LeMaire et al. | 437/217 |
| 5,172,214 | 12/1992 | Casto | 437/220 |
| 5,304,843 | 4/1994 | Takubo et al. | 437/217 |
| 5,363,279 | 11/1994 | Cha | 257/692 |

FOREIGN PATENT DOCUMENTS

| | | |
|---|---|---|
| 52-30184 | 7/1977 | Japan . |
| 63-015451 | 1/1988 | Japan . |
| 63-015453 | 1/1988 | Japan . |
| 63-190363 | 8/1988 | Japan . |
| 3-94438 | 4/1991 | Japan . |
| 3-157959 | 7/1991 | Japan . |
| 3-280554 | 12/1991 | Japan . |
| 4-044347 | 2/1992 | Japan . |

Primary Examiner—Kevin Picardat
Attorney, Agent, or Firm—Staas & Halsey

[57] ABSTRACT

A semiconductor device includes a semiconductor chip (11) having a top surface and a bottom surface, a plurality of leads (14) arranged under the bottom surface of the semiconductor chip (11), where the leads (14) have first ends (14a) electrically coupled to the semiconductor chip (11) and second ends which form external terminals (16) and each of the external terminals have a bottom surface, and a package (17, 31) encapsulating the semiconductor chip (11) and the leads (14) so that the bottom surface of each of the external terminals (16) is exposed at a bottom surface (17a, 31a) of the package (17, 31) and remaining portions of the leads (14) are embedded within the package (17, 31), where the package (17, 31) has a size which is approximately the same as that of the semiconductor chip (11) in a plan view viewed from above the top surface of the semiconductor chip (11).

5 Claims, 14 Drawing Sheets 5,773,313

SEMICONDUCTOR DEVICE AND METHOD OF PRODUCING THE SAME

This application is a division of application Ser. No. 08/136,462, filed Oct. 15, 1993, now U.S. Pat. No. 5,519, 251.

BACKGROUND OF THE INVENTION

The present invention generally relates to semiconductor devices and methods of producing the same, and more particularly to a semiconductor device which has only a portion of leads exposed at a bottom surface of a package so as to improve the packaging density of the semiconductor device, and to a method of producing such a semiconductor device.

Due to the recent improvements in reducing the size, increasing the operation speed and increasing the functions of electronic equipments, there are demands to realize similar improvements in semiconductor devices. In addition to these demands on the semiconductor devices per se, there are also demands to improve the packaging density of the semiconductor device when packaging the semiconductor device on a substrate.

Accordingly, although the majority of the existing semiconductor devices employ the surface mounting which connects the leads at the surface of the substrate, there are demands to further improve the packaging density of the semiconductor devices.

FIG. 1 shows a perspective view of an example of a conventional semiconductor device 1. FIG. 2 is a cross sectional view of this semiconductor device 1 taken along a line 2—2 in FIG. 1. For example, this type of semiconductor device was proposed in Japanese Laid-Open Patent Applications No. 63-15453 and No.63-15451.

In FIGS. 1 and 2, the semiconductor device 1 generally includes a semiconductor chip 2, a resin package 3 which encapsulates the semiconductor chip 2, a plurality of leads 4, and a stage 7 on which the semiconductor chip 2 is mounted. One end 4a of the lead 4 is connected to the semiconductor chip 2 via a wire 5, and the other end of the lead 4 is exposed at a bottom surface 3a of the package 3 to form an external terminal 6. In other words, all parts of the semiconductor device 1 excluding the external terminals 6 of the leads 4 are encapsulated within the package 3.

Because the external terminals 6 of the leads 4 are exposed at the bottom surface 3a of the package 3 in this semiconductor device 1, the projecting length of the leads 4 on the outer side of the package 3 can be made small, thereby making it possible to improve the packaging density. In addition, the external terminals 6 of the leads 4 do not need to be bent as in the case of the conventional leads having the L-shape or gull-wing shape. As a result, no mold is required to bend the external terminals 6, thereby making it possible to simplify the production process and to reduce the production cost.

On the other hand, another type of semiconductor device was proposed in a Japanese Laid-Open Patent Application No.4-44347. According to this proposed semiconductor device, the leads are fixed to a circuit forming surface of the semiconductor chip via an insulative adhesive agent. In addition, the size of the package is reduced by encapsulating only the circuit forming surface or only the circuit forming surface and side surfaces of the semiconductor chip.

However, according to the semiconductor device 1 described above, the end 4a of the lead 4 is located on both sides of the semiconductor chip 2. As a result, there is a limit to reducing the size of the package 3, and there was a problem in that the size of the semiconductor device 1 cannot be reduced to a sufficient extent. In other words, the size of the semiconductor device ideally is approximately the same as the size of the semiconductor chip. However, the size of the semiconductor device 1 is approximately two or more times greater than the size of the semiconductor chip 2.

In addition, the semiconductor device 1 does not take the heat radiation into any consideration. That is, there was a problem in that the semiconductor device 1 cannot efficiently radiate the heat generated from the semiconductor chip 2 outside the package 3.

On the other hand, according to the semiconductor device proposed in the Japanese Laid-Open Patent Application No. 4-44347, the leads which are connected to an external substrate are apart from the package, and thus, the transfer mold technique cannot be employed as the package forming technique, and the troublesome potting technique must be employed. As a result, this proposed semiconductor device requires troublesome processes to produce, and there were problems in that the production efficiency of the semiconductor device is poor and the production cost of the semiconductor device is high. It is theoretically possible to produce this semiconductor device by employing the transfer mold technique, however, this would require the mold to be made up of a large number of split molds, and this technique is impractical in that the mold would become extremely expensive.

SUMMARY OF THE INVENTION

Accordingly, it is a general object of the present invention to provide a novel and useful semiconductor device and a method of producing the same, in which the problems described above are eliminated.

Another and more specific object of the present invention is to provide a semiconductor device comprising a semiconductor chip having a top surface and a bottom surface, a plurality of leads arranged under the bottom surface of the semiconductor chip, where the leads have first ends electrically coupled to the semiconductor chip and second ends which form external terminals and each of the external terminals have a bottom surface, and a package encapsulating the semiconductor chip and the leads so that the bottom surface of each of the external terminals is exposed at a bottom surface of the package and remaining portions of the leads are embedded within the package, where the package has a size which is approximately the same as that of the semiconductor chip in a plan view viewed from above the top surface of the semiconductor chip. According to the semiconductor device of the present invention, it is possible to considerably reduce the size of the semiconductor device to approximately the same size as the semiconductor chip in the plan view.

Still another object of the present invention is to provide a method of producing a semiconductor device comprising the steps of (a) press working a lead frame and forming a plurality of leads which extend inwards to a predetermined position where a semiconductor chip is to be mounted, (b) mounting the semiconductor chip at the predetermined position on a stage, where the steps (a) and (b) are carried out in an arbitrary order, (c) wire-bonding first ends of the leads to the semiconductor chip via wires, and (d) encapsulating the semiconductor chip and the leads by a resin package so that a bottom surface of the leads is exposed at second end at a bottom surface of the resin package. According to the method of producing the semiconductor device of the present invention, it is possible to produce the semiconductor device which is considerably small compared to the conventional semiconductor device using simple processes. In addition, since the leads are embedded within the resin package and the second ends (external terminals) of the leads are exposed at the bottom surface of the resin package, it is possible to employ the transfer mold technique as the package forming technique. As a result, it is possible to form the resin package with ease and improve the production yield and also reduce the production cost.

Other objects and further features of the present invention will be apparent from the following detailed description when read in conjunction with the accompanying drawings.

DESCRIPTION OF THE PREFERRED EMBODIMENTS

Figure 3A:
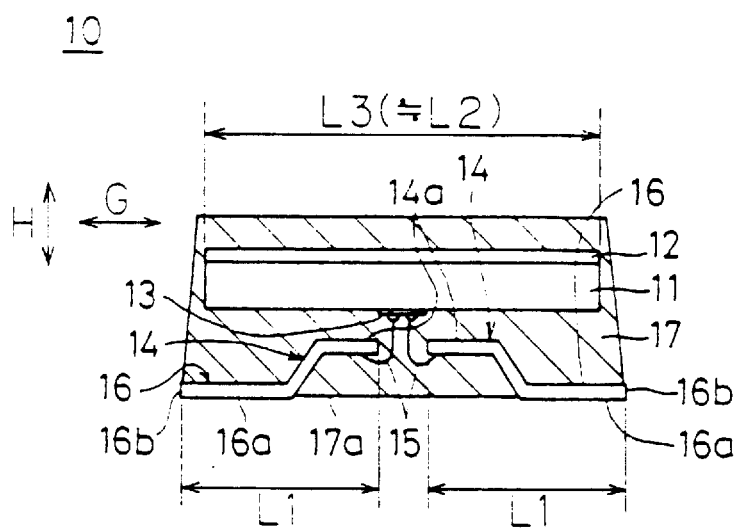
FIGS. 3A and 3B respectively are a cross sectional view and a perspective view showing a first embodiment of a semiconductor device according to the present invention.

A description will be given of a first embodiment of the semiconductor device according to the present invention, by referring to FIGS. 3A and 3B. FIG. 3A shows a cross sectional view of the first embodiment, and FIG. 3B shows a perspective view of the first embodiment.

Figure 3B:
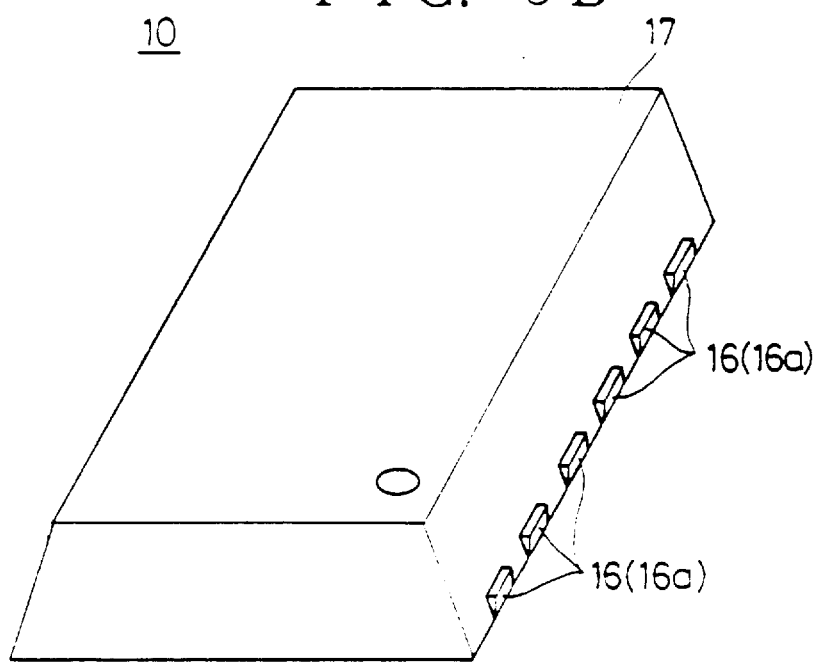

A semiconductor device 10 shown in FIGS. 3A and 3B includes a semiconductor chip 11 which is mounted on a stage 12. For example, this semiconductor chip 11 is a memory chip which is relatively large. In addition, electrode pads 13 of the semiconductor chip 11 are arranged at the central part on the top surface of the semiconductor chip 11 along the longitudinal direction thereof, as may be seen from FIG. 5A which will be described later.

One end 14a of each lead 14 is connected to the electrode pad 13 of the semiconductor chip 11 via a wire 15. In addition, each lead 14 is bent with respect to a direction H which is taken along the height of the semiconductor device 10, and has an approximate Z-shape when view from the side as shown in FIG. 3A. Accordingly, each lead 14 first extends horizontally from the end 14a in FIG. 13A, thereafter extends down, and then extends horizontally again at the other end. As will be described later, the end of the lead 14 opposite to the end 14a forms an external terminal 16.

A resin package 17 encapsulates the semiconductor chip 11, the wires 15 and the plurality of leads 14. In the plan view, this package 17 has a size which is approximately the same as (or slightly larger than) the area of the semiconductor chip 11. In other words, the package 17 is considerably small compared to the conventional package.

Figure 4:
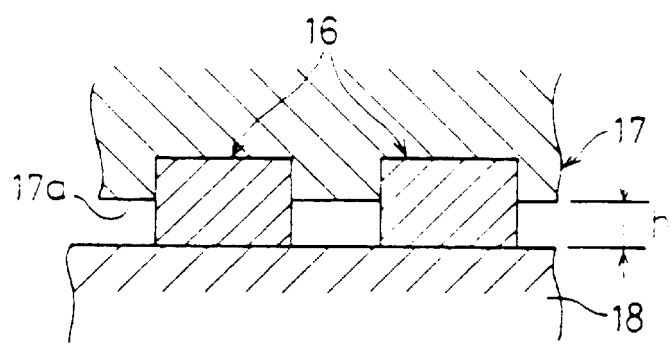
FIG. 4 is a cross sectional view on an enlarged scale showing the first embodiment of the semiconductor device in a vicinity of external terminals.

A bottom portion 16a and an end portion 16b of the external terminal 16 of the lead 14 are exposed at a bottom surface 17a of the package 17. Hence, the semiconductor device 10 is mounted on a circuit substrate 18 which is shown in FIG. 4 by soldering the external terminals 16 to the circuit substrate 18. As shown in FIG. 4, the external terminal 16 slightly projects from the bottom surface 17a of the package 17. Accordingly, a gap h is formed between the top surface of the circuit substrate 18 and the bottom surface 17a of the package 17, so as to improve the soldering characteristics. For example, the external terminal 16 can be made to project from the bottom surface 17a of the package 17 by forming a groove in the mold at a position corresponding to the external terminal 16 when carrying out a resin molding to form the package 17. In other words, the external terminal 16 can be made to project from the bottom surface 17a of the package 17 with relative ease.

Of course, it is not essential to make the external terminal 16 project a distance h from the bottom surface 17a of the package 17. That is, h may be equal to 0 so that the bottom surface 17a of the package 17 may make contact with the top surface of the circuit substrate 18. Therefore, the distance h may be set to satisfy a relationship $h \leq t$, where t denotes the thickness of the lead 14.

Next, a description will be given of the construction of the semiconductor device 10 by referring again to FIG. 3A. In the plan view of the semiconductor device 10, the leads 14 and the semiconductor chip 11 overlap each other within the package 17.

If a length of each lead 14 in a horizontal direction G is denoted by L1, an amount of overlap L2 between the lead 14 and the semiconductor chip 11 can be described by L2≈2·L1. Since the area of the package 17 and the area of the semiconductor chip 11 in the plan view are approximately the same, the length of the semiconductor device 10 in the horizontal direction G becomes L3 if a length of the semiconductor chip 11 is denoted by L3.

Figure 1:
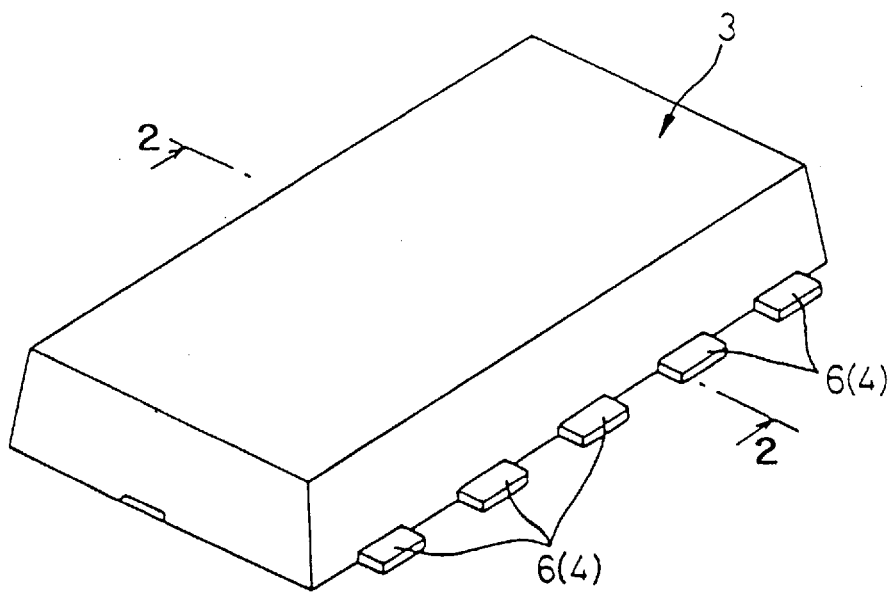
FIG. 1 is a perspective view showing an example of a conventional semiconductor device.
Figure 2:
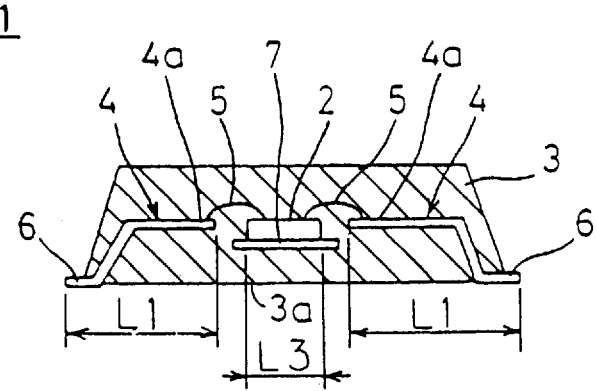
FIG. 2 is a cross sectional view of the semiconductor device taken along a line A—A in FIG. 1.

On the other hand, according to the conventional semiconductor device 1 shown in FIGS. 1 and 2, a length L4 of the package 3 is approximately a sum of the length L3 of the semiconductor chip 11, the length L1 of the leads 4 on one side, and the length of the leads 4 on the other side of the semiconductor chip 2. In other words, L4=L3+2·L1.

Therefore, it may be seen that the size of the semiconductor device 10 of this embodiment can be reduced by the overlap L2 compared to the size of the conventional semiconductor device 1. In addition, because the semiconductor device 10 is considerably small compared to the conventional semiconductor device 1, it is possible to improve the mounting efficiency of the semiconductor device 10 with respect to the circuit substrate 18, and thereby reduce the size and improve the performance of the equipments which are mounted with the semiconductor device 10.

Next, a description will be given of an embodiment of a method of producing the semiconductor device according to the present invention, by referring to FIGS. 5 through 9. This embodiment of the method produces the semiconductor device 10 described above.

Figure 5A:
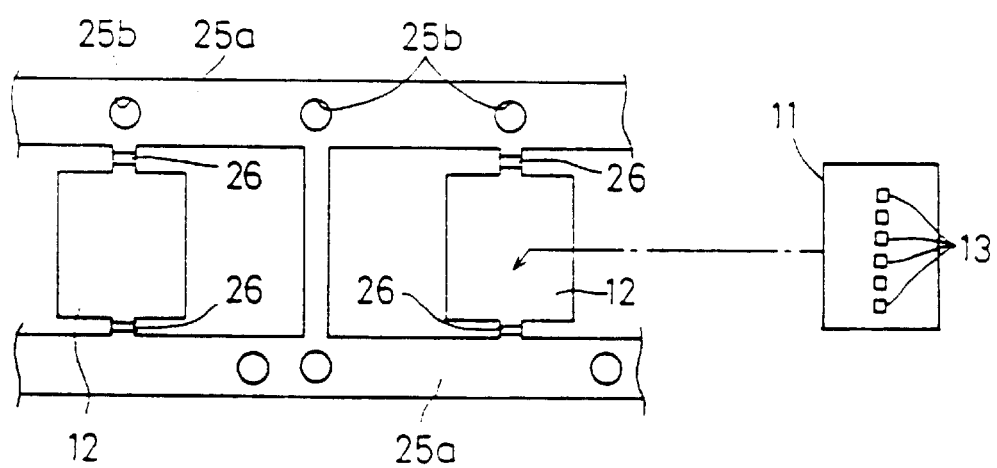
FIGS. 5A and 5B respectively are a plan view and a side view for explaining an embodiment of a method of producing the semiconductor device according to the present invention.
Figure 5B:
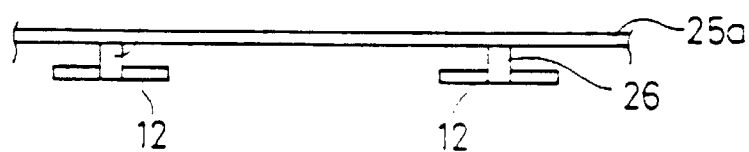

FIG. 5A shows a plan view of a lead frame 25 having stages 12 on which the semiconductor chip 11 is mounted, and FIG. 5B shows a side view of this lead frame 25. Frame portions 25a, the stages 12, and support bars 26 for supporting the stages 12 on the frame portions 25a shown in FIG. 5A are formed by press working, stamping or etching processes. The support bar 26 has a stepped portion, so that the stage 12 is located at a position lower than that of the frame portion 25a, as shown in FIG. 5B.

Figure 6:
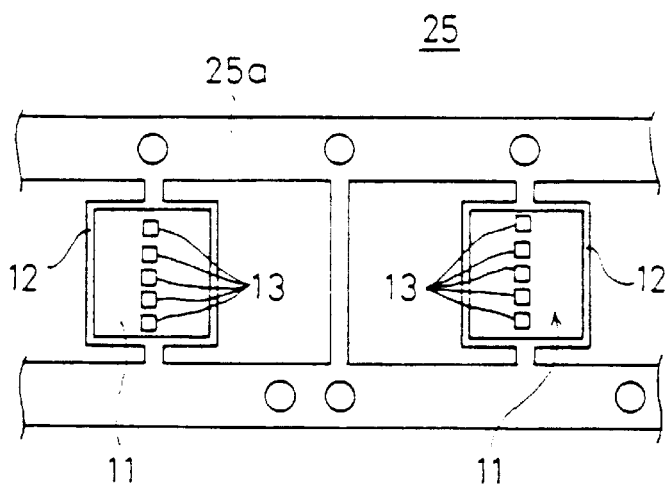
FIG. 6 is a plan view for explaining the embodiment of the method of producing the semiconductor device according to the present invention.

After the lead frame 25 is formed, the semiconductor chip 11 is die-bonded on the stage 12. FIG. 6 shows the lead frame 25 which is mounted with the semiconductor chips 11. As described above, the electrode pads 13 of the semiconductor chip 11 are arranged at the central portion on the top surface of the semiconductor chip 11.

Figure 7A:
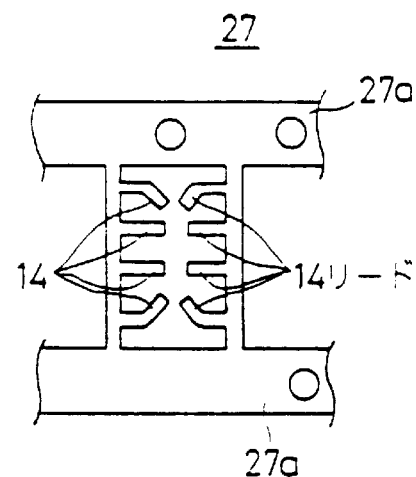
FIGS. 7A and 7B respectively are a plan view and a side view for explaining the embodiment of the method of producing the semiconductor device according to the present invention.
Figure 7B:
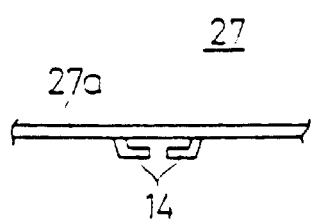

On the other hand, FIG. 7A shows a plan view of a lead frame 27 for forming the leads 14, and FIG. 7B shows a side view of this lead frame 27. The lead frame 27 is formed independently of the lead frame 25, by carrying out press working, punching or etching processes. Frame portions 27a and a plurality of leads 14 are formed on the lead frame 27, and the leads 14 extend towards the inside for a predetermined length. In addition, the leads 14 are located at a position lower than that of the frame portion 27a. The leads 14 may be made to extend for this predetermined length by merely modifying the mold which is used for the press working, and thus, the above described leads 14 can be formed with ease.

Figure 8A:
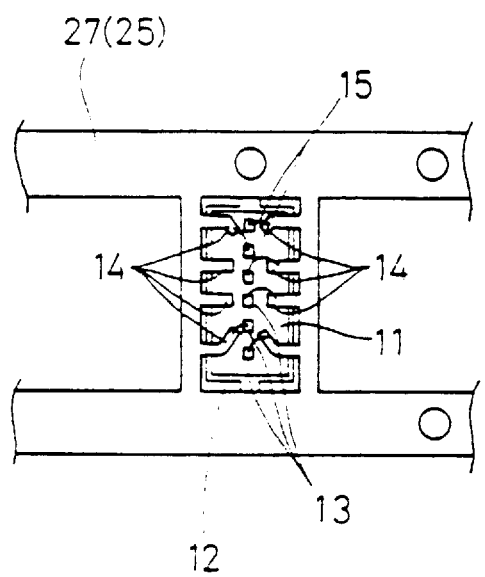
FIG. 8A and 8B respectively are a plan view and a side view for explaining the embodiment of the method of producing the semiconductor device according to the present invention.
Figure 8B:
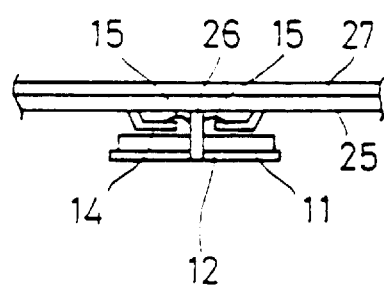

FIGS. 8A and 8B respectively are a plan view and a side view showing the lead frame 25 and the lead frame 27 in an overlapping stage. More particularly, the lead frame 27 is placed on top of the lead frame 25. The lead frames 25 and 27 can be positioned with ease by matching positioning holes 25b and 27b of the respective lead frames 25 and 27.

As described above, the leads 14 of the lead frame 27 extend to the inside for the predetermined length and are lower than the frame portions 27a by a predetermined amount. Accordingly, in the overlapping stage of the lead frames 25 and 27, the leads 14 extend to the vicinities of the electrode pads of the semiconductor chip 11 which is mounted on the lead frame 25. That is, the leads 14 overlap the semiconductor chip 11 in the plan view.

After the lead frames 25 and 27 are positioned in the overlapping stage, the ends 14a of the leads and the electrode pads 13 of the semiconductor chip 11 are wire-bonded. As a result, the leads 14 and the electrode pads 13 are electrically connected via the wires 15.

When the wire-bonding process ends, the lead frames 25 and 27 are loaded into a mold which is used to form the package 17 by a resin molding process. When molding this package 17, it is possible to employ the transfer mold technique as the package forming method because the external leads 16 of the leads 14 are exposed to the outside. In other words, the leads 14 are embedded within the package 17 and only the external terminals 16 are exposed at the bottom surface of the package 17. For this reason, it is possible to form the package 17 with ease using the mold, and the production cost can be reduced because of the improved production yield.

After the package 17 is formed by the resin molding process, unwanted portions of the lead frames 25 and 27 are cut and removed, thereby completing the semiconductor device 10 shown in FIGS. 3A and 3B.

Hence, this embodiment of the method is characterized by the steps of (i) overlapping the lead frames 25 and 27, and (ii) extending the leads of the lead frame 27 to the inside for the predetermined length. The step (i) itself is already employed in a LOC (Lead On Chip) type semiconductor device production process, and the step (ii) can be realized by modifying the mold which is used when forming the lead frame 27. Therefore, it is possible to produce the semiconductor device 10 without greatly modifying the conventional semiconductor device production process.

Figure 9A:
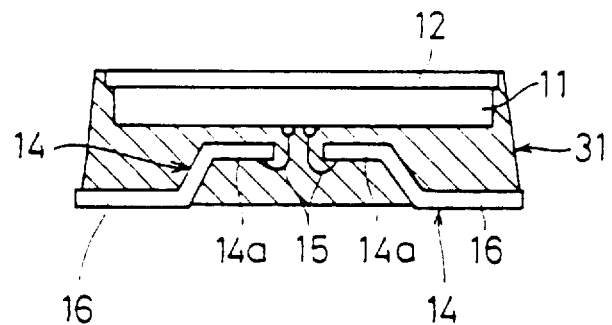
FIGS. 9A and 9B respectively are a cross sectional view and a perspective view showing a second embodiment of the semiconductor device according to the present invention.
Figure 9B:
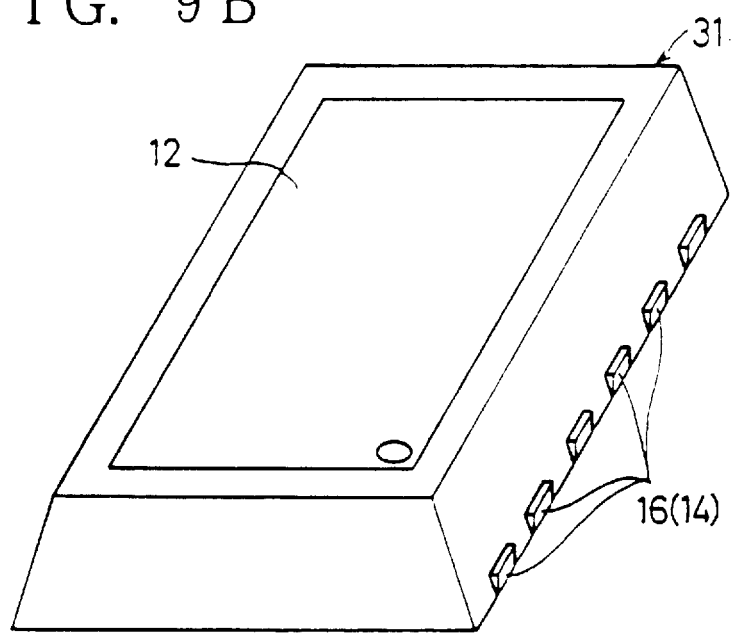

Next, a description will be given of a second embodiment of the semiconductor device according to the present invention, by referring to FIGS. 9A and 9B. FIG. 9A shows a cross section of the second embodiment of the semiconductor device, and FIG. 9B shows a perspective view of the second embodiment of the semiconductor device. In FIGS. 9A and 9B, those parts which are the same as those corresponding parts in FIGS. 3A and 3B are designated by the same reference numerals, and a description thereof will be omitted.

A semiconductor device 30 shown in FIGS. 9A and 9B has the stage 12 which is exposed at a top portion of a package 31, so as to improve the heat radiation efficiency of the heat which is generated from the semiconductor chip 11 which is mounted on the stage 12. This semiconductor device 30 can easily be produced by carrying out the resin molding process in a stage where the stage 12 makes direct contact with a cavity of the mold which is used for the resin molding.

The heat which is generated from the semiconductor chip 11 is efficiently radiated outside the package 30 via the stage 12 which is exposed at the top portion of the package 31. Accordingly, it is possible to improve the heat radiation efficiency of the semiconductor chip 11. In addition, unlike the semiconductor device 10 shown in FIGS. 3A and 3B, no resin exists above the stage 12, and the thickness of the semiconductor device 30 can be reduced by a corresponding amount.

Figure 10A:
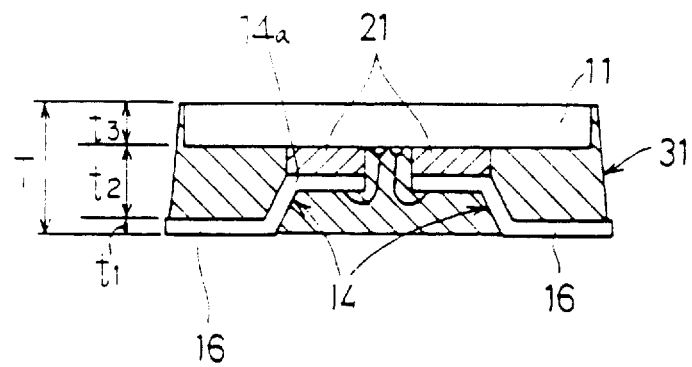
FIGS. 10A, 10B and 10C respectively are cross sectional views showing first, second and third modifications of the second embodiment of the semiconductor device.

FIG. 10A shows a first modification of the second embodiment of the semiconductor device. In FIG. 10A, those parts which are the same as those corresponding parts in FIGS. 9A and 9B are designated by the same reference numerals, and a description thereof will be omitted.

In this first modification, the semiconductor chip 11 is exposed at the top portion of the package 31 in a LOC type semiconductor device 35, so as to improve the heat radiation efficiency similarly to the semiconductor device 30 shown in FIGS. 9A and 9B.

In the first and second embodiments, the resin of the package 17 or 31 fills the space between the semiconductor chip 11 and the end portions 14a of the leads 14. But in this first modification, the tip portions 14a of the leads 14 are adhered on the semiconductor chip 11 via adhesive tapes 21. Because the top surface of the semiconductor chip 11 is directly exposed at the top portion of the package 31, it is possible to further improve the heat radiation efficient and further reduce the thickness of the semiconductor device 35 compared to the semiconductor device 30.

In this first modification, a thickness t1 of the lead 14 is approximately 0.018 μm to 0.150 μm, a distance t2 between the top surface of the lead 14 and the bottom surface of the semiconductor chip 11 is approximately 0.100 μm to 200 μm, and a thickness t3 of the semiconductor chip 11 is approximately 200 μm to 400 μm. Accordingly, a thickness T of the semiconductor device 35 is approximately 200.118 μm if the minimum values for t1, t2 and t3 are used. Hence, it can be seen that the thickness T of the semiconductor device 35 is extremely small.

Figure 10B:
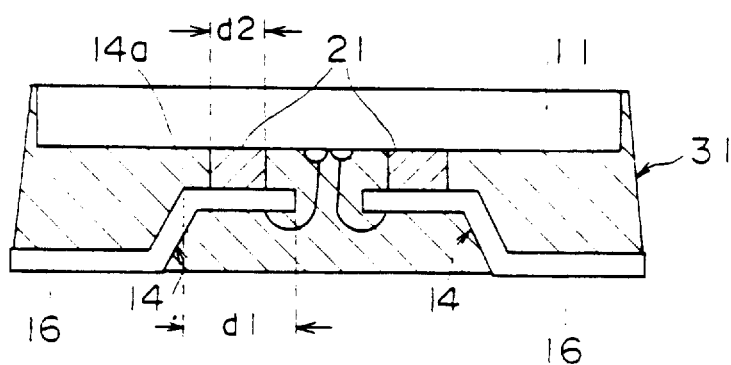

FIG. 10B shows a second modification of the second embodiment of the semiconductor device. In FIG. 10B, those parts which are the same as those corresponding parts in FIG. 10A are designated by the same reference numerals, and a description thereof will be omitted.

In this second modification, a length d1 of the tip portion 14a of the lead 14 and a length d2 of the adhesive tape 21 satisfy a relationship d2≦d1. In other words, the adhesive tape 21 does not need to make contact with the tip end portion 14a of the lead 14 for the entire length of the tip end portion 14a. However, the length d2 is preferably greater than or equal to d½ so that the tip end portions 14a of the leads 14 are positively adhered to the semiconductor chip 11. For example, the thickness of the adhesive tape 21 is approximately 50 μm to 100 μm, and the thickness of the lead 14 is approximately 35 μm to 150 μm.

Figure 10C:
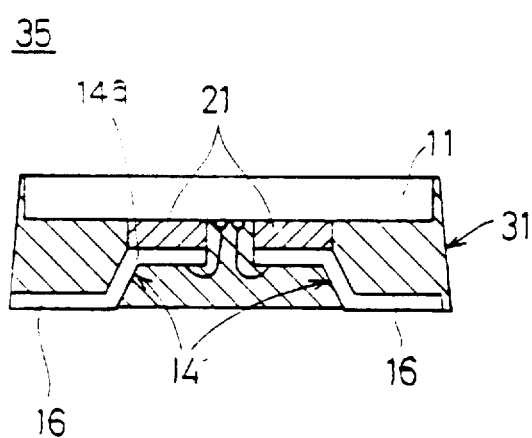

FIG. 10C shows a third modification of the second embodiment of the semiconductor device. In FIG. 10C, those parts which are the same as those corresponding parts in FIG. 10A are designated by the same reference numerals, and a description thereof will be omitted.

In this third modification, the external terminals 16 do not extend outside the package 31 in the horizontal direction in FIG. 10C. In other words, the end of the external terminal 16 and the side surface of the package 31 may match as shown on the left hand side of FIG. 10C or, the end of the external terminal 16 may be located on the inner side of the side surface of the package 31 as shown on the right hand side of FIG. 10C. In the latter case, the package 31 covers the side of the tip end of the external terminal 16.

Figure 11:
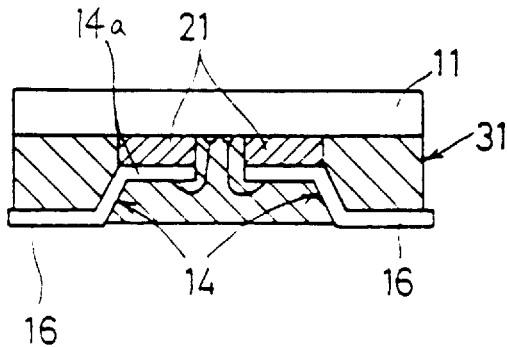
FIG. 11 is a cross sectional view showing a fourth modification of the second embodiment of the semiconductor device.

FIG. 11 shows a fourth modification of the second embodiment of the semiconductor device. In FIG. 11, those parts which are the same as those corresponding parts in FIGS. 9A and 9B are designated by the same reference numerals, and a description thereof will be omitted.

In this fourth modification, the size of the resin package 31 and the size of the semiconductor chip 11 of a semiconductor device 20 in a plan view are made the same as shown in FIG. 11. According to this fourth modification, the size of the semiconductor device 20 in the plan view can be minimized.

Figure 12A:
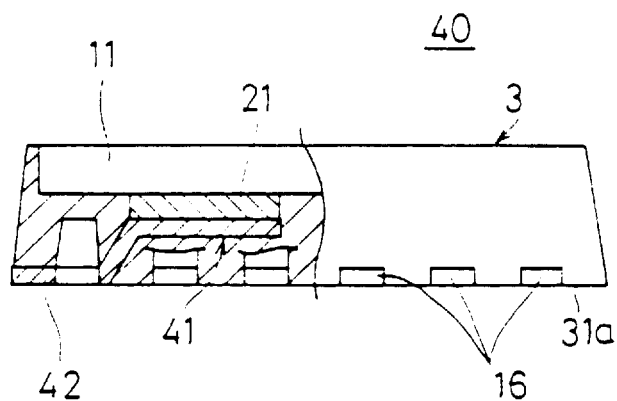
FIGS. 12A and 12B respectively are a cross sectional view in part and a bottom view showing a third embodiment of the semiconductor device according to the present invention.
Figure 12B:
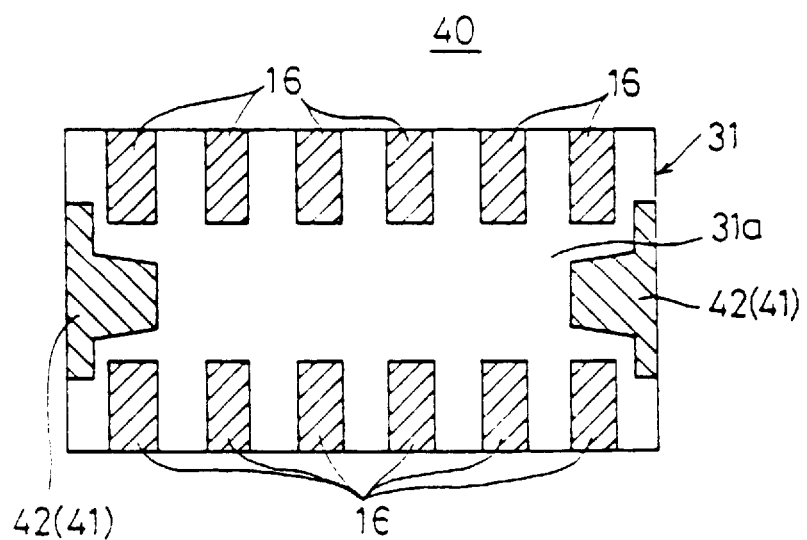

Next, a description will be given of a third embodiment of the semiconductor device according to the present invention, by referring to FIGS. 12A and 12B. FIG. 12A shows a partial cross section of the third embodiment, and FIG. 12B shows a bottom view of the third embodiment. In FIGS. 12A and 12B, those parts which are the same as those corresponding parts in FIGS. 9A and 9B are designated by the same reference numerals, and a description thereof will be omitted.

In this embodiment, a semiconductor device 40 is also the LOC type. The top surface of the semiconductor device 11 is exposed at the top portion of the package 31 as shown in FIG. 12A, similarly to the semiconductor device 20 shown in FIG. 11, so as to improve the heat radiation efficiency. In addition, a radiation frame 41 is provided under the semiconductor chip 11, and radiator portions 42 are provided at ends of the radiation frame 41. The radiator portions 42 are exposed at a bottom surface 31a of the package 31 as shown in FIG. 12B. The semiconductor chip 11 and the radiation frame 41 are connected via an adhesive tape 21 which is made of a material having a satisfactory thermal conduction, so that the heat generated from the semiconductor chip 11 is transferred to the radiation frame 41 via the adhesive tape 21 and radiated to the outside via the radiator portions 42.

According to this semiconductor device 40, the heat which is generated from the semiconductor chip 11 is not only radiated from the top surface of the semiconductor chip 11 which is exposed at the top portion of the package 31, but is also radiated from the bottom surface 31a of the package 31. As a result, the effective heat radiation area is increased, thereby making it possible to even further improve the heat radiation efficiency.

Figure 13:
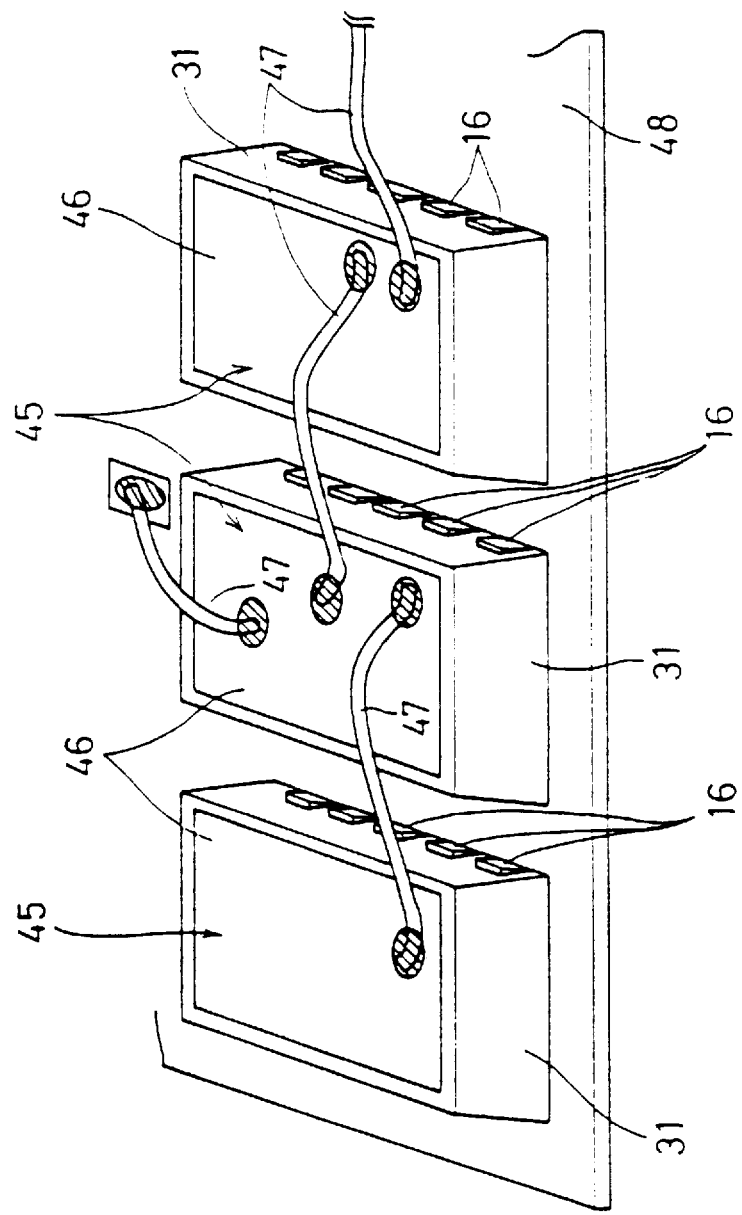
FIG. 13 is a perspective view showing a fourth embodiment of the semiconductor device according to the present invention.

FIG. 13 shows a fourth embodiment of the semiconductor device according to the present invention. In this embodiment, the top surfaces of the semiconductor chips 11 or the top surfaces of the stages 12 are exposed at the top portion of the package 31, similarly to the semiconductor devices 30, 35 and 40 described above. If the top surface of the semiconductor chip 11 is exposed, a metal film made of Au or the like is formed on this exposed surface by sputtering, for example. On the other hand, if the top surface of the stage 12 is exposed, a metal film made of Au, Ag or the like or a solder layer is plated on this exposed surface. As a result, the conductor film formed on the exposed surface of the semiconductor chip 11 or stage 12 can be used as an electrical terminal 46. The potential of the semiconductor chip 11 is drawn out at the terminal 46.

According to this semiconductor device 46, the terminals 46 can be connected via jumper lines 47 or the like, so as to facilitate the wiring of the semiconductor devices 45 by enabling the wiring above the semiconductor devices 45 in addition to the wiring printed on a circuit substrate 48 on which the semiconductor devices 46 are mounted. In other words, the wiring of the semiconductor devices 46 can be designed with a larger degree of freedom, thereby improving the mounting efficiency.

Figure 14A:
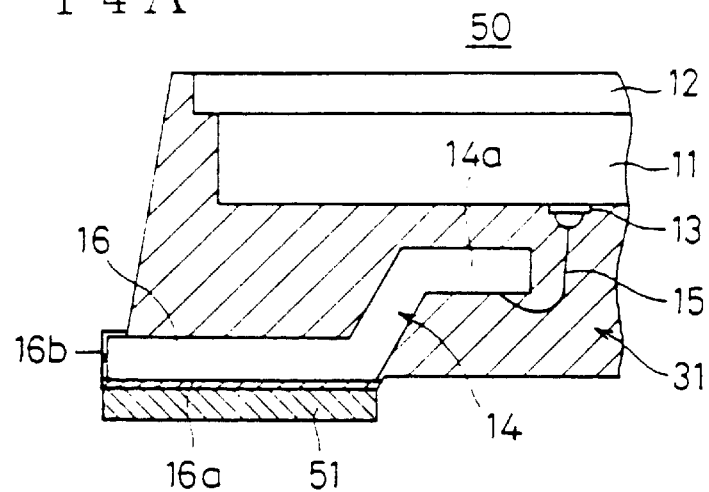
FIGS. 14A, 14B and 14C respective are a cross sectional view, a perspective view and a cross sectional view for explaining a fifth embodiment of the semiconductor device according to the present invention.
Figure 14B:
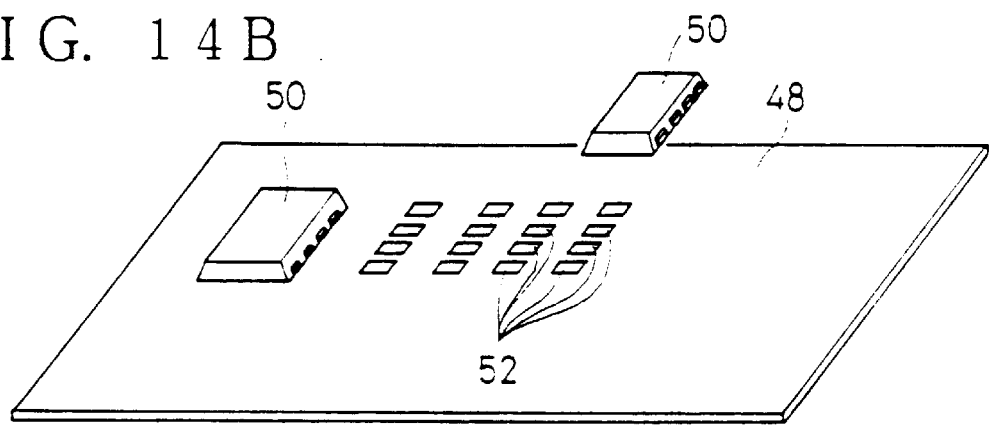
Figure 14C:
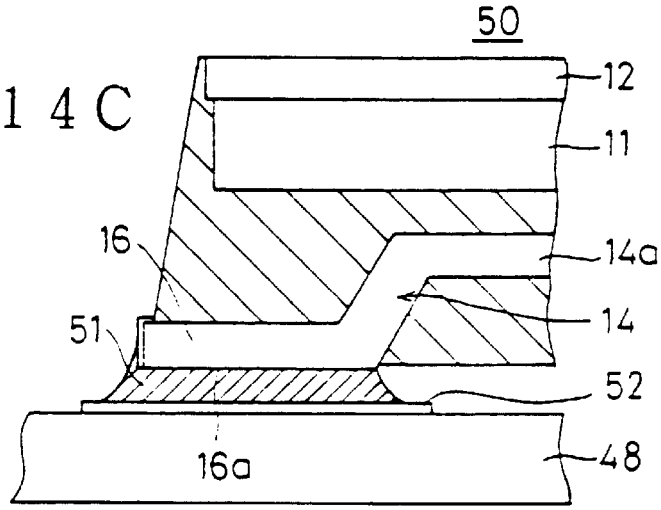

Next, a description will be given of a fifth embodiment of the semiconductor device according to the present invention, by referring to FIGS. 14A through 14C. FIG. 14A shows a cross sectional view of an essential part of this embodiment, FIG. 14B is a perspective view for explaining the mounting of this embodiment on a circuit substrate, and FIG. 14C is a cross sectional view of an essential part of this embodiment for explaining the mounting of this embodiment. In FIGS. 14A through 14C, those parts which are the same as those corresponding parts in FIGS. 9A and 9B are designated by the same reference numerals, and a description thereof will be omitted.

According to this embodiment, a semiconductor device 50 has the external terminals 16 with a processed bottom surface 16a. In other word, dimples similar to those formed on a golf ball are formed on the bottom surface 16a of the external terminal 16 of the lead 14 exposed outside the package 31. In addition, a conductive adhesive agent 51 which has a small elasticity is provided on the bottom surface 16a. Because the surface area of the external terminal 16 is increased by the dimples which are formed on the bottom surface 16a of the external terminal 16, the conductive adhesive agent 51 is positively adhered on the external terminal 16.

The leads 14 are made of a metal, while the circuit substrate 48 is generally made of a material such as epoxy-glass. Hence, the coefficients of thermal expansion of the materials forming the leads 14 and the circuit substrate 48 are different. As a result, when the semiconductor device 50 is mounted on the circuit substrate 48 and heated for soldering, a stress is generated due to the difference between the coefficients of thermal expansion. This stress may cause damage to the connecting portions and cause an electrical contact failure.

For this reason, the conductive adhesive agent 51 is provided on the bottom surface 16a of the external terminal 16 so as to prevent the stress from being generated due to the difference between the coefficients of thermal expansion of the leads 14 and the circuit substrate 48. In other words, the conductive adhesive agent 51 has a small elasticity but is thermally plastic, so that the difference between the thermal expansions of the external terminals 16 and the circuit substrate 48 can be absorbed by the conductive adhesive agent 51.

Therefore, according to this embodiment, it is possible to positively prevent damage to the semiconductor device 50 by preventing the stress from being generated in the semiconductor device 50 or the circuit substrate 48. In addition, when the semiconductor device 50 is shipped or forwarded, the conductive adhesive agent 51 is already provided on the external terminals 16. Hence, the user (or customer) does not need to carry out the usual soldering in order to mount the semiconductor device 50 on the circuit board 48. Hence, the mounting process carried out by the user is simplified, and the mounting cost is greatly reduced because no soldering equipment is necessary for the mounting process.

Of course, it is not essential that the conductive adhesive agent 51 is provided on the external terminal 16. The conductive adhesive agent 51 may be provided on each electrode pad 52 of the circuit substrate 48 shown in FIG. 14B on which the semiconductor device 50 is mounted. In this case, the external terminal 16 is adhered on the conductive adhesive agent 51 which is provided on the electrode pad 52, and a reflow process is carried out to thermally harden the conductive adhesive agent 51.

FIG. 14C shows a state where the external terminal 16 is connected to the electrode pad 52 of the circuit substrate 48 via the conductive adhesive agent 51 which is provided beforehand on the external terminal 16 as shown in FIG. 14A or on the electrode pad 52 shown in FIG. 14B.

Figure 15A:
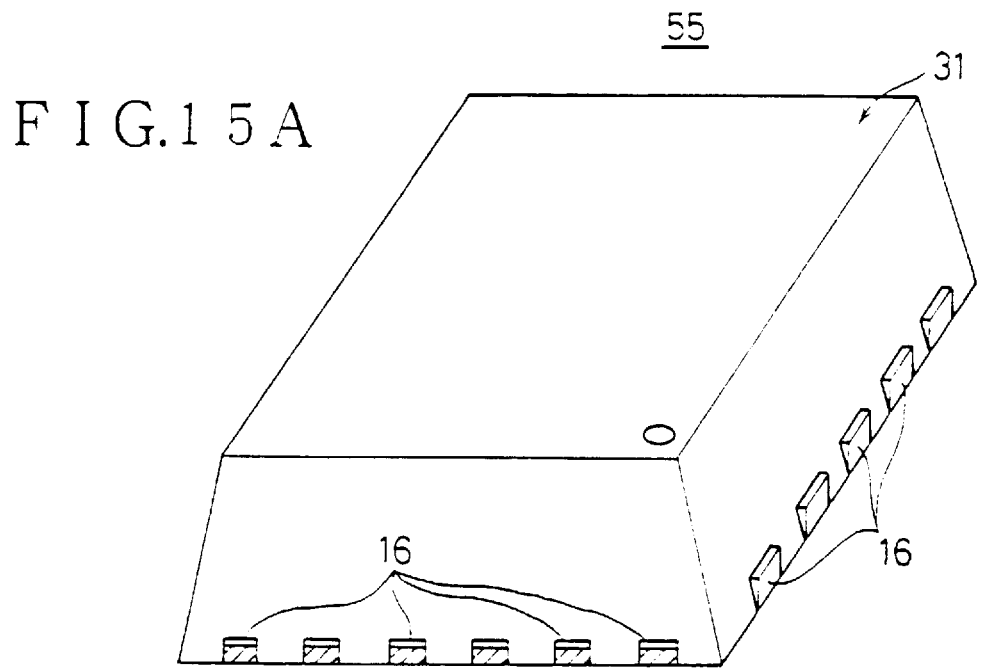
FIGS. 15A and 15B respectively are a perspective view and a bottom view showing a sixth embodiment of the semiconductor device according to the present invention.
Figure 15B:
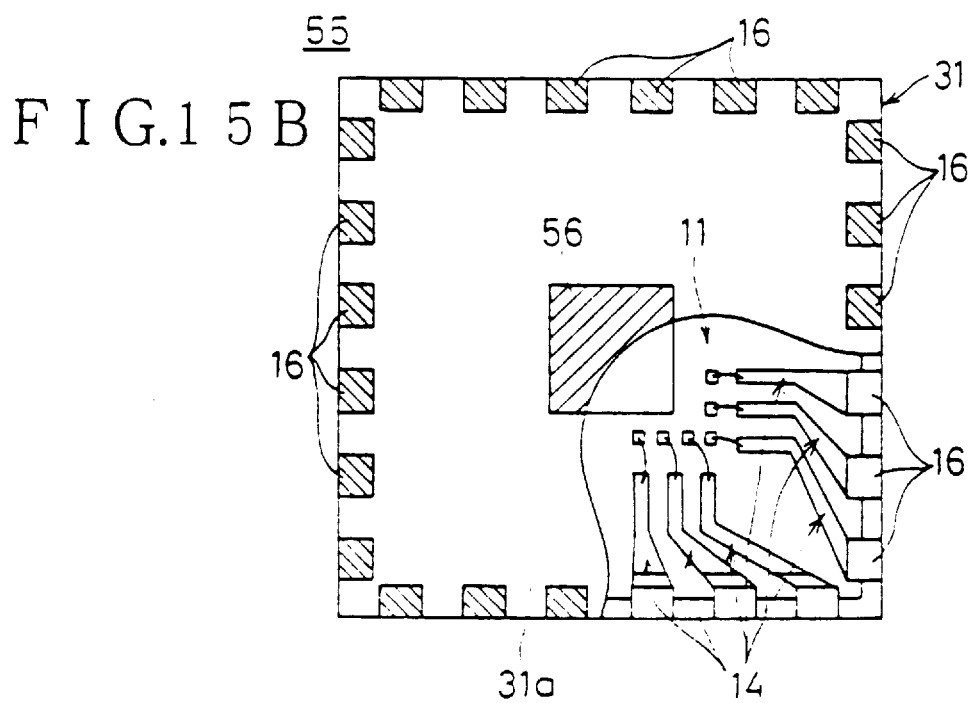

Next, a description will be given of a sixth embodiment of the semiconductor device according to the present invention, by referring to FIGS. 15A and 15B. FIG. 15A shows a perspective view of the sixth embodiment, and FIG. 15B shows a bottom view of the sixth embodiment. In FIGS. 15A and 15B, those parts which are the same as those corresponding parts in FIGS. 9A and 9B are designated by the same reference numerals, and a description thereof will be omitted.

In this embodiment, the present invention is applied to the so-called QFP (Quad Flat Package) type semiconductor device. In a semiconductor device 55 shown in FIGS. 15A and 15B, the leads 14 surround the semiconductor chip 11. In addition, a radiation frame 56 is provided with radiator fins.

Figure 16A:
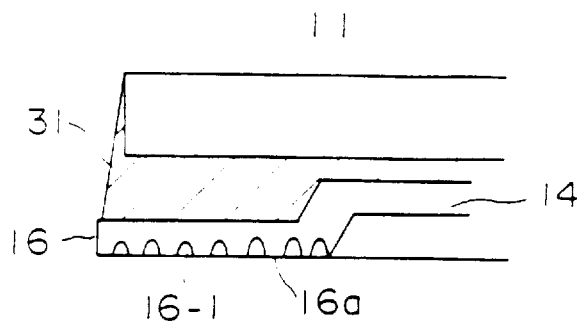
FIGS. 16A and 16B respectively are a cross sectional view and a plan view showing an essential part of a seventh embodiment of the semiconductor device according to the present invention.
Figure 16B:
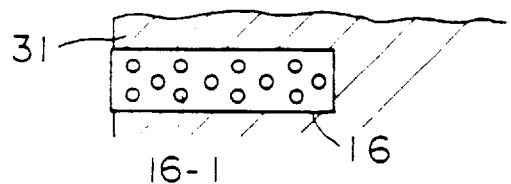

Next, a description will be given of a seventh embodiment of the semiconductor device according to the present invention, by referring to FIGS. 16A and 16B. FIG. 16A shows a cross section of an essential part of this seventh embodiment, and FIG. 16B shows a bottom view of an essential part of this seventh embodiment. In FIGS. 16A and 16B, those parts which are the same as those corresponding parts in FIG. 10A are designated by the same reference numerals, and description thereof will be omitted.

In this embodiment, a bottom surface 16a of the external terminal 16 of at least some of the leads 14 has dimples 16-1 formed thereon.

The conventional semiconductor device having the leads which extend outwards from the package can absorb to a certain extent the difference between the coefficients of thermal expansion of the leads and the circuit substrate on which the semiconductor device is mounted, because the outwardly extending leads are flexible and are shaped to absorb the difference. However, if the external terminals 16 do not extend outwardly of the package 31 and is substantially embedded within the package 31, it is desirable to take some kind of measure to increase the strength of the semiconductor device with respect to the stress which will be generated by the difference between the coefficients of thermal expansion of the leads 14 and the circuit substrate 48 on which the semiconductor device is mounted. Hence, this embodiment increases the surface area of the bottom surface 16a of the external terminal 16 to increase the strength. In addition to increasing the strength, it is possible to facilitate the coating of an adhesive agent on the external terminal 16, such as when applying the conductive adhesive agent 51 as described above in conjunction with FIGS. 14A through 14C.

Figure 17A:
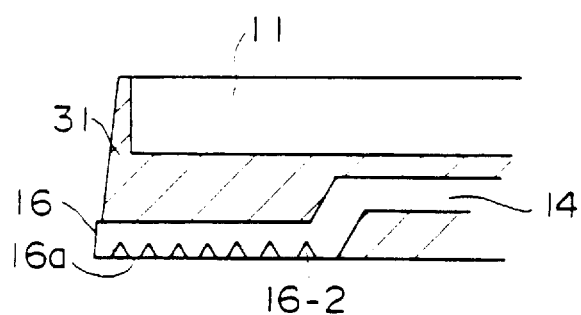
FIGS. 17A and 17B respectively are a cross sectional view and a plan view showing an essential part of an eighth embodiment of the semiconductor device according to the present invention.
Figure 17B:
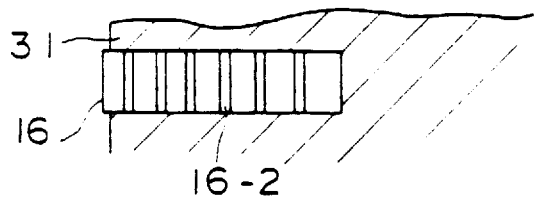

Next, a description will be given of an eighth embodiment of the semiconductor device according to the present invention, by referring to FIGS. 17A and 17B. FIG. 17A shows a cross section of an essential part of this eighth embodiment, and FIG. 17B shows a bottom view of an essential part of this eighth embodiment. In FIGS. 17A and 17B, those parts which are the same as those corresponding parts in FIG. 10A are designated by the same reference numerals, and description thereof will be omitted.

In this embodiment, a bottom surface 16a of the external terminal 16 of at least some of the leads 14 has grooves 16-2 formed thereon. The effects of this embodiment are basically the same as those of the seventh embodiment.

Figure 18:
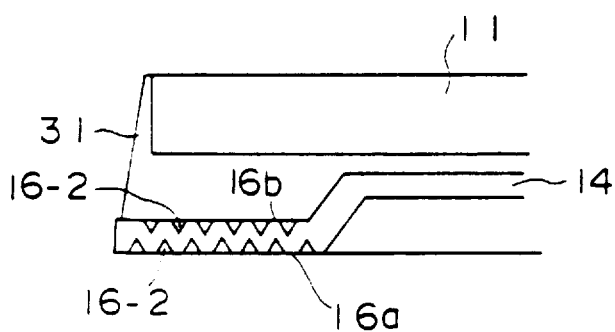
FIG. 18 is a cross sectional view showing an essential part of a ninth embodiment of the semiconductor device according to the present invention.

Next, a description will be given of a ninth embodiment of the semiconductor device according to the present invention, by referring to FIG. 18. FIG. 18 shows a cross section of an essential part of this ninth embodiment. In FIG. 18, those parts which are the same as those corresponding parts in FIG. 10A are designated by the same reference numerals, and description thereof will be omitted.

In this embodiment, both a top surface 16a and a bottom surface 16a of the external terminal 16 of at least some of the leads 14 have grooves 16-2 formed thereon. The effects of this embodiment are basically the same as those of the seventh embodiment.

Further, the present invention is not limited to these embodiments, but various variations and modifications may be made without departing from the scope of the present invention.

What is claimed is:

1. A method of producing a semiconductor device comprising the steps of:
   (a) press working a lead frame and forming a plurality of leads which extend inward to a position where a semiconductor chip is to be mounted, said leads being arranged under a bottom surface of the semiconductor chip;
   (b) mounting the semiconductor chip at the position on a stage, said steps (a) and (b) being carried out in an arbitrary order;
   (c) wire-bonding first ends of the leads to the semiconductor chip via wires; and
   (d) encapsulating the semiconductor chip and the leads by a resin package so that a bottom surface of the leads is exposed at a second end at a bottom surface of the resin package, said resin package comprising side surfaces which are substantially planar.

2. The method of producing the semiconductor device as claimed in claim 1, wherein said step (d) fills a gap between the first ends of the terminals and the semiconductor chip by the resin which forms the resin package.

3. The method of producing the semiconductor device as claimed in claim 1, wherein said step (d) covers a top surface of the semiconductor chip by the resin which forms the resin package.

4. The method of producing the semiconductor device as claimed in claim 1, wherein said step (d) exposes a top surface of the semiconductor chip from the resin package.

5. The method of producing the semiconductor device as claimed in claim 4, wherein said step (d) further exposes side surfaces of the semiconductor chip so that side surfaces of the resin package and the side surfaces of the semiconductor chip match.

* * * * *